US012241925B2

(12) United States Patent
Bhalwankar et al.

(10) Patent No.: US 12,241,925 B2
(45) Date of Patent: Mar. 4, 2025

(54) ARC FAULT DETECTION MODULES FOR VEHICLE ELECTRICAL SYSTEMS

(71) Applicant: Eaton Intelligent Power Limited, Dublin (IE)

(72) Inventors: Chaitanya Bhalwankar, Pune (IN); Ritika Shetty, Pune (IN); Brandon William Fisher, Portland, OR (US); Kumar Prasad Telikepalli, Pune (IN); Naresh Kumar Kodela, Pune (IN)

(73) Assignee: EATON INTELLIGENT POWER LIMITED, Dublin (IE)

( * ) Notice: Subject to any disclaimer, the term of this patent is extended or adjusted under 35 U.S.C. 154(b) by 194 days.

(21) Appl. No.: 17/789,468

(22) PCT Filed: Dec. 28, 2020

(86) PCT No.: PCT/EP2020/025600
§ 371 (c)(1),
(2) Date: Jun. 27, 2022

(87) PCT Pub. No.: WO2021/129956
PCT Pub. Date: Jul. 1, 2021

(65) Prior Publication Data
US 2023/0034902 A1 Feb. 2, 2023

(30) Foreign Application Priority Data

Dec. 27, 2019 (IN) .............................. 201911054197
Nov. 6, 2020 (IN) .............................. 202011048605

(51) Int. Cl.
*G01R 31/12* (2020.01)
*G01R 31/00* (2006.01)

(52) U.S. Cl.
CPC ....... *G01R 31/007* (2013.01); *G01R 31/1272* (2013.01)

(58) Field of Classification Search
CPC .. G01R 31/007; G01R 31/1272; G01R 31/14; H02H 1/0015; H02H 1/00; H02H 3/00;
(Continued)

(56) References Cited

U.S. PATENT DOCUMENTS 6,057,997 A  5/2000 Mackenzie et al.
6,567,759 B2 5/2003 Dollar, II
(Continued)

FOREIGN PATENT DOCUMENTS

CN  103548226 A  1/2014
CN  103869226 A  6/2014
(Continued)

OTHER PUBLICATIONS

International Search Report and Written Opinion for PCT/EP2020/025600; mailed Apr. 12, 2021; pp. 1-11.

*Primary Examiner* — Feba Pothen
*Assistant Examiner* — Brent J Andrews
(74) *Attorney, Agent, or Firm* — Talem IP Law, LLP

(57) ABSTRACT

Arc fault detection modules for vehicles intended to supervise circuits and detect arc fault conditions in both alternating current and direct current circuits. A number of these arc fault detection modules may be integrated into a vehicle's electrical system in strategic locations. Each arc fault module contains sensing capabilities for monitoring the circuit, and may also include signal conditioning capabilities, processing capabilities for determining the occurrence of an arc fault, contactors for disabling the supervised circuit, and communications capabilities to interact with other vehicle components and telematics systems. As a result arc fault detection odules can be customized to leverage existing features of a vehicle's electrical system or to provide fully redundant arc fault protection.

8 Claims, 8 Drawing Sheets

(58) Field of Classification Search
CPC .. H02H 5/00; H02H 6/00; H02H 7/00; H02H 9/00; H02H 11/00; H02H 99/00
See application file for complete search history.

(56) References Cited

U.S. PATENT DOCUMENTS

| | | |
|---|---|---|
| 6,577,138 B2 | 6/2003 | Zuercher et al. |
| 6,594,125 B2 | 7/2003 | Dollar, II |
| 6,633,824 B2 | 10/2003 | Dollar, II |
| 6,782,329 B2 | 8/2004 | Scott |
| 7,177,125 B2 | 2/2007 | Lazarovich et al. |
| 7,205,772 B2 | 4/2007 | Naidu et al. |
| 7,406,370 B2 | 7/2008 | Kojori et al. |
| 7,460,344 B2 | 12/2008 | Hastings et al. |
| 8,218,274 B2 | 7/2012 | Hastings et al. |
| 8,289,664 B2 | 10/2012 | Haines et al. |
| 8,335,062 B2 | 12/2012 | Haines et al. |
| 9,606,165 B2 | 3/2017 | Chatroux et al. |
| 9,612,267 B2 | 4/2017 | Kolker et al. |
| 9,768,605 B2 | 9/2017 | Kolker et al. |
| 9,797,940 B2 | 10/2017 | Kolker et al. |
| 9,797,941 B2 | 10/2017 | Kolker et al. |
| 9,933,463 B2 | 4/2018 | Danesh et al. |
| 9,941,683 B2 | 4/2018 | Olivas et al. |
| 9,948,087 B2 | 4/2018 | Haines et al. |
| 2004/0156154 A1 | 8/2004 | Lazarovich et al. |
| 2004/0263183 A1 | 12/2004 | Naidu et al. |
| 2005/0017731 A1 | 1/2005 | Zuercher et al. |
| 2005/0057261 A1 | 3/2005 | Hale et al. |
| 2006/0200688 A1 | 9/2006 | Tofigh et al. |
| 2006/0214670 A1 | 9/2006 | Naidu et al. |
| 2006/0291109 A1 | 12/2006 | Wang |
| 2008/0129307 A1 | 6/2008 | Yu |
| 2010/0214703 A1 | 8/2010 | Tofigh et al. |
| 2012/0206844 A1 | 8/2012 | Tofigh et al. |
| 2015/0194798 A1 | 7/2015 | Ward |
| 2016/0341769 A1* | 11/2016 | Danesh ............... H02H 3/006 |
| 2018/0269013 A1* | 9/2018 | Thompson ............ B60L 53/68 |

FOREIGN PATENT DOCUMENTS

| | | |
|---|---|---|
| CN | 103913663 A | 7/2014 |
| CN | 104428160 A | 3/2015 |
| CN | 204424865 U | 6/2015 |
| CN | 106696705 A | 5/2017 |
| CN | 107234969 A | 10/2017 |
| CN | 108528241 A | 9/2018 |
| CN | 108646724 A | 10/2018 |
| DE | 102017004157 A1 | 10/2017 |
| DE | 102016219855 A1 | 4/2018 |
| EP | 2711236 A2 | 3/2014 |
| GB | 2479418 A | 10/2011 |
| WO | 2017201125 A1 | 11/2017 |

\* cited by examiner

ARC FAULT DETECTION MODULES FOR VEHICLE ELECTRICAL SYSTEMS

This is a United States § 371 National Stage Application of PCT/EP2020/025600 filed Dec. 28, 2020 and claims the benefit of Indian provisional application 20/191,1054197 filed Dec. 27, 2019, and claims the benefit of Indian provisional 202011048605 filed Nov. 6, 2020, all of which are incorporated herein by reference.

FIELD

The present application refers to modules which can be used in a vehicle's electrical system to identify and react to arc fault conditions.

BACKGROUND

The use of arc fault detection modules is important in vehicle applications as there are a number of scenarios where high current flows are necessary within conventional, hybrid and electric vehicles such as automobiles. The most obvious example in a vehicle application would be a case where an electric vehicle's motor is starting. When an electric motor starts, it requires a high current flow, and in some configurations, an arc will occur.

This could potentially cause a traditional automotive fuse or circuit breaker to trip, even though the high current flow associated with motor startup is expected. Existing arc fault detection strategies for vehicles can require expensive components that are typically centralized.

SUMMARY

The disclosed arc fault detection module for a vehicle overcomes the above limitations of fuses, circuit breakers, and existing arc fault detection systems by supervising the circuit and continuously checking to determine if the circuit is experiencing a normal arc condition, or an arc fault condition which must be addressed. The arc fault detection module for a vehicle can either work independently or with other vehicle systems (such as the power distribution unit and electronic control unit) via the vehicle's internal network (Controller Area Network, or CAN bus) to perform four basic functions—sense, signal condition, process the conditioned signal, and act when an arc fault is detected.

A smaller arc fault detection module can be distributed around the vehicle and connected to individual loads or small clusters of loads. Then, the smaller arc fault detection module can be less expensive than a centralized component. Additionally, the smaller arc fault detection module can be more closely tailored for the load, as by being designed for either a high or low voltage load, or a DC or AC current configuration. With smaller arc fault detection modules, unaffected vehicle systems can function normally if a discrete arc occurs, and the arc fault detector is more able to react in its intended environment for high or low voltages and DC or AC faults. Below are additional alternatives for actuating a contactor to interrupt a load or cluster of loads.

A module for detecting arc fault in in one of an alternating current circuit or a direct current circuit in a power distribution system of a vehicle can comprise an arc fault detection unit comprising one or more sensors configured for monitoring an alternating current circuit or a direct current circuit for signs of an arc fault and configured for outputting arc fault data; signal conditioning circuitry for receiving and translating arc fault data for processing; a processing unit connected directly or indirectly to the signal conditioning circuitry, the processing unit configured to receive arc fault data from the signal conditioning circuitry and configured to identify an arc fault condition; and a notification device connected to the processing unit, the notification device configured to notify a supervisory controller of an arc fault and configured to communicate other data to the supervisory controller.

The processing unit can be connected directly to the signal conditioning circuitry in the arc fault detection module.

A notification device can be directly connected to the arc fault detection module.

The processing unit can be remote from the arc fault detection unit and communicate via the vehicle's Controller Area Network, or CAN bus.

The notification device may be replaced by a contactor directly or indirectly connected to the processing unit, with the contactor configured to interrupt a flow of current when the arc fault condition is identified.

The processing unit can be a microcontroller, where the microcontroller is configured to command the notification device to indicate when a fault has occurred; and where the microcontroller is configured to issue commands to a contactor to interrupt a flow of alternating current circuit or direct current through the circuit monitored by the arc fault detection module.

Alternatively, the processing unit can be a centralized electronic control unit, where the centralized electronic control unit is configured to receive and process signal data from other arc fault detection modules and controllers connected to the power distribution system of the vehicle. The centralized electronic control unit is configured to receive and process the arc fault data and to determine when an arc fault condition has occurred, and transmit a command to the contactor to interrupt a flow of alternating current circuit or direct current through the circuit monitored by the arc fault detection unit.

These modules can be configured for installation on either a direct current or alternating current circuit, including direct or indirect connections to a powered unit, such as an on-board charger, an inverter, or a DC-DC converter.

Variants of the arc fault detection module can be configured so they may act independently of other aspects of the vehicle's electrical system. These modules are configured to observe an alternating current circuit or a direct current circuit for signs of an arc fault and include the signal conditioning circuitry, processing logic and a contactor capable of disabling current flow to the observed circuit. When the processing logic determines an arc fault has occurred, it can take independent action to disable current flow through the circuit. The module will then maintain the circuit in a disabled state until physically reset or commanded to reset by a supervisory controller. The module can also be configured such that a supervisory controller may enable or disable the observed circuit, as the result of an arc fault detection event or in cases where the supervisory controller decides that disabling the circuit is advantageous.

Within the vehicle electrical system, there are also potential configurations where alternating current and direct current circuits in a vehicle's electrical system are monitored by arc fault detection modules networked to a supervisory controller using the vehicle's Controller Area Network (or CAN bus). The supervisory controller is further networked to a number of remote contactors within the vehicle able to disable current flow through the monitored circuits. The arc fault detection modules sense, condition, and determine when an arc fault has occurred, transmitting this conclusion to the supervisory controller. The supervisory controller will then take action to address the arc fault detection event based on its programming to manage current flow in the vehicle electrical system by commanding the remote contactors.

Another potential configuration utilizes arc fault detection modules capable of independently disabling current flow on a circuit in combination with modules which transmit an arc fault detection event to the supervisory controller, which then uses remote contactors to disable current flow through the monitored circuit.

A vehicle electric system can comprise a supervisory controller networked to at least one remote contactor, a first circuit comprising a first module, and a second circuit comprising a second module.

The first circuit and the second circuit are selected among an alternating current circuit or direct current circuit. The first module comprises first processing logic and a first contactor configured to disable the first circuit independently of the supervisory controller when an arc fault is detected. The second module is configured to transmit arc fault detection data to a supervisory controller. The supervisory controller can be programmed to receive and process the transmitted arc fault detection data, and, when an arc fault condition is detected, the supervisory controller can be programmed to manage current flow in the vehicle electrical system by commanding at least one remote contactor to disable.

Additional objects and advantages will be set forth in part in the description which follows, and in part will be obvious from the description, or may be learned by practice of the disclosure. The objects and advantages will also be realized and attained by means of the elements and combinations particularly pointed out in the appended claims.

It is to be understood that both the foregoing general description and the following detailed description are exemplary and explanatory only and are not restrictive of the claimed invention.

DETAILED DESCRIPTION

Reference will now be made in detail to the examples which are illustrated in the accompanying drawings. Wherever possible, the same reference numbers will be used throughout the drawings to refer to the same or like parts. Directional references such as "left" and "right" are for ease of reference to the figures.

Figure 4A:
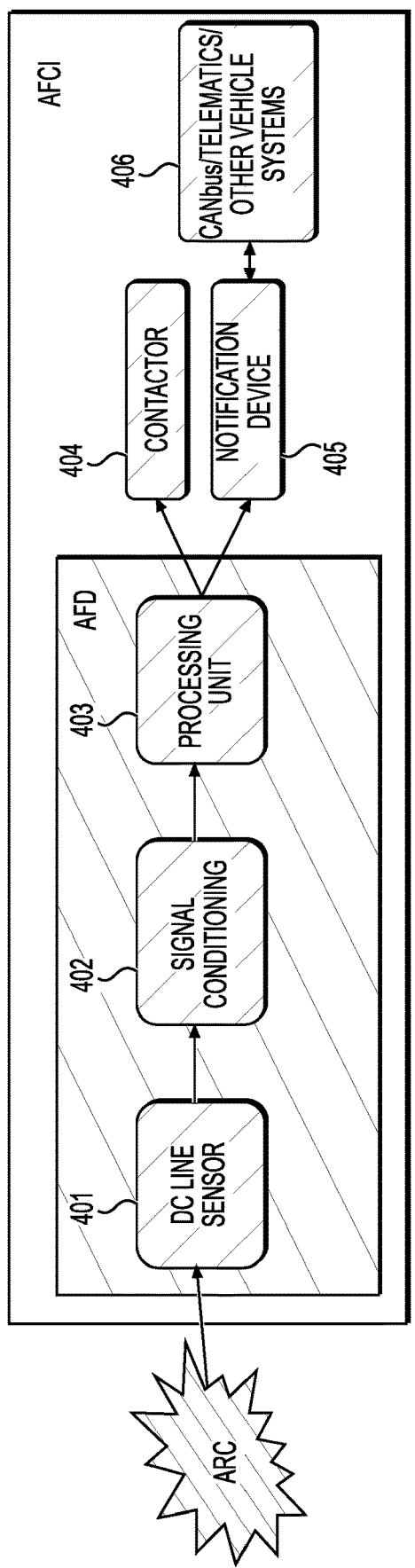
FIG. 4A includes a diagram showing information flow within a type of arc fault detection module.

To understand the basic components of an arc fault detection module, we can look to FIG. 4A, which is a block diagram showing the basic components and functions of an arc fault detection module with arc fault circuit interrupter (AFCI) capability. Similar to each arc fault detection module, it has a sensor attached to a monitored circuit 401. To detect an arc fault condition the sensor signal must be conditioned using signal conditioning logic 402, and also processed by an algorithm able to determine if an arc fault has occurred, in this case by a processing unit 403. If an arc fault is identified, a contactor 404 (such as a relay) is opened, and a notification device 405 can communicate to other vehicle systems or telematics systems to inform them of the arc fault condition via the CAN bus 406.

As seen in FIGS. 1,2, 3A, 4A, and 5A, which serve as examples of conceptual electrical and conventional vehicle layouts, these types of modules exist for both alternating current and direct current circuits.

There are a number of different configurations of an arc fault detection module 301. One example is referred to as an arc fault detector (AFD). This includes sensing capabilities, stored signal conditioning logic and processing capability (such as a microcontroller or other device comprising a RAM, ROM, DRAM, ePROM, or other memory device configured with stored and executable programming) for determining if an arc fault condition has occurred and is installed to monitor the protected circuit. If an arc fault occurs, a notification is made to a supervisory controller, in this case the centralized ECU 302. An alternate implementation would be to remove the processing unit from the arc fault detection module 301, and to utilize the centralized ECU 302 to process the conditioned signal from the sensor monitoring the circuit. ECU 302 would coordinate control of numerous vehicle devices and ECU 302 would comprise processing and memory devices with stored programming commensurate with that coordinated control.

In all cases, to provide full arc fault circuit interruption (AFCI) capabilities, the arc fault detection module must be able to, directly or indirectly, command a contactor 303 (such as a relay) to open and stop current flow through the monitored circuit when an arc fault condition is identified. While the module can be fully autonomous in certain configurations, the existence of an arc fault condition can be transmitted both within the vehicle, as shown in the block diagram representation of an arc fault detection module which utilizes a central ECU 300, as well as in the block diagram representation of an arc fault circuit interruption module with notification capabilities 400 and also in block diagram representation of an arc fault detection module which utilizes separate AC and DC ECUs in FIG. 5b, or even on to an external network, such as the Internet, as shown in the power distribution units for electric vehicles 112 and 212. Instructions may also be received from the supervisory controller over the vehicle's internal network as shown by the arrows between the microcontroller 150 and DC-AFCI components 120-124 in FIG. 1.

Figure 1:
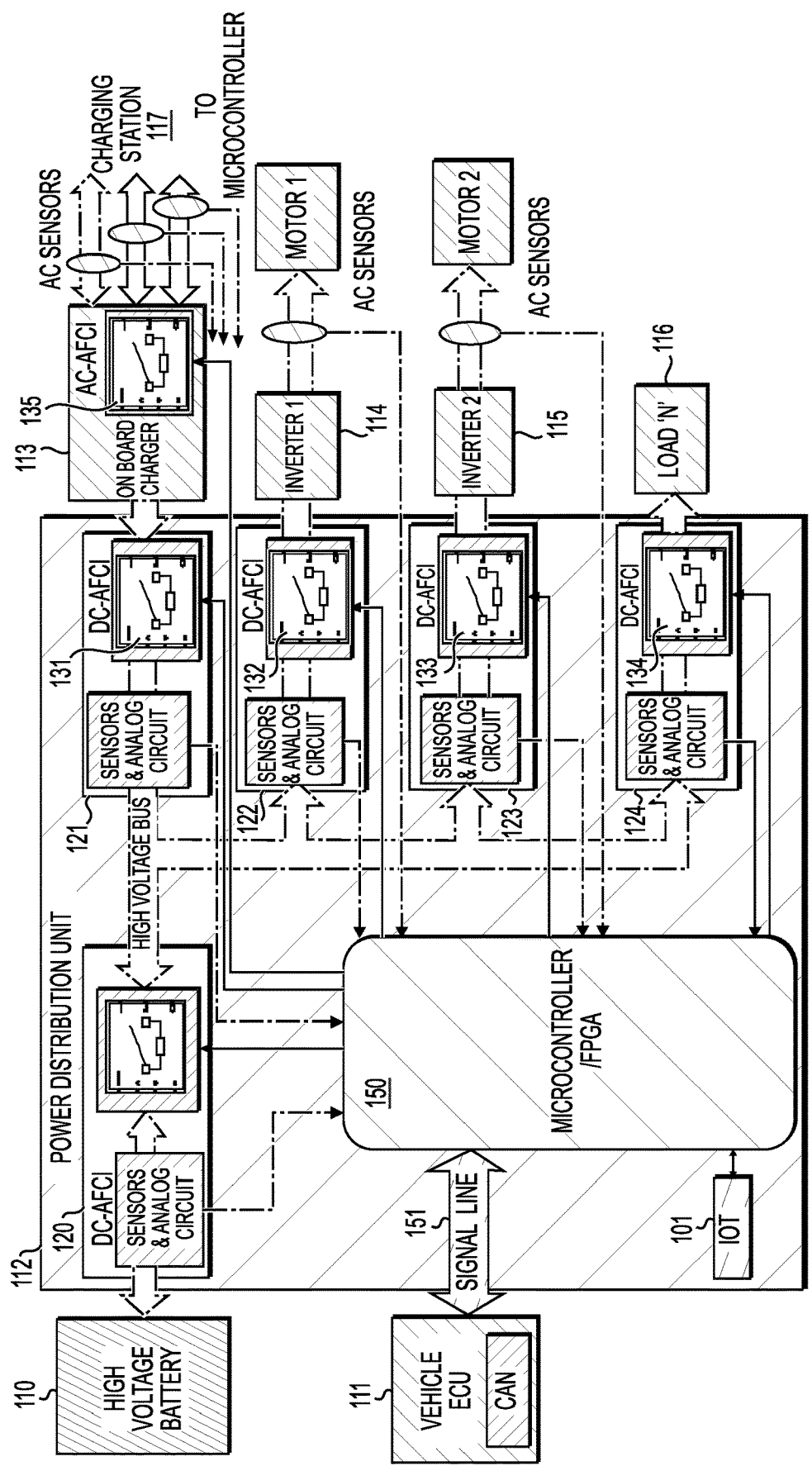
FIG. 1 an explanatory view of an electric vehicle's electrical system showing the installation of arc fault detection modules.

In order to demonstrate how the modules might be deployed within an electric vehicle, FIG. 1 shows a conceptual diagram of the vehicle's major systems. The system consists of a high voltage battery 110, an electronic control unit 111, a power distribution unit 112, an on-board charger 113, two inverter circuits 114 and 115, and a low voltage load, 116. Within the power distribution unit, there are arc fault circuit interrupters ("AFC's") 120-124 which communicate with a microcontroller 102 networked to the internet. External to the power distribution unit, the on-board charger 113 is also in communication with the microcontroller, as is the charging station 117 when the vehicle is charging. AFCI 121 terminates flow to the power distribution unit from the on-board charger if it detects and arc fault by opening contactors 131, while AFCIs 122 and 123 terminate flow to motor 1 and 2 in the event of an arc fault condition by opening contactors 132 and 133. AFCI 124 is used to protect low voltage loads in the vehicle 116 (such as low voltage motors, convenience features like radio, air conditioner or interior lights, and other components within the vehicle). Again, if an arc fault is detected contactors 134 open.

Figure 2:
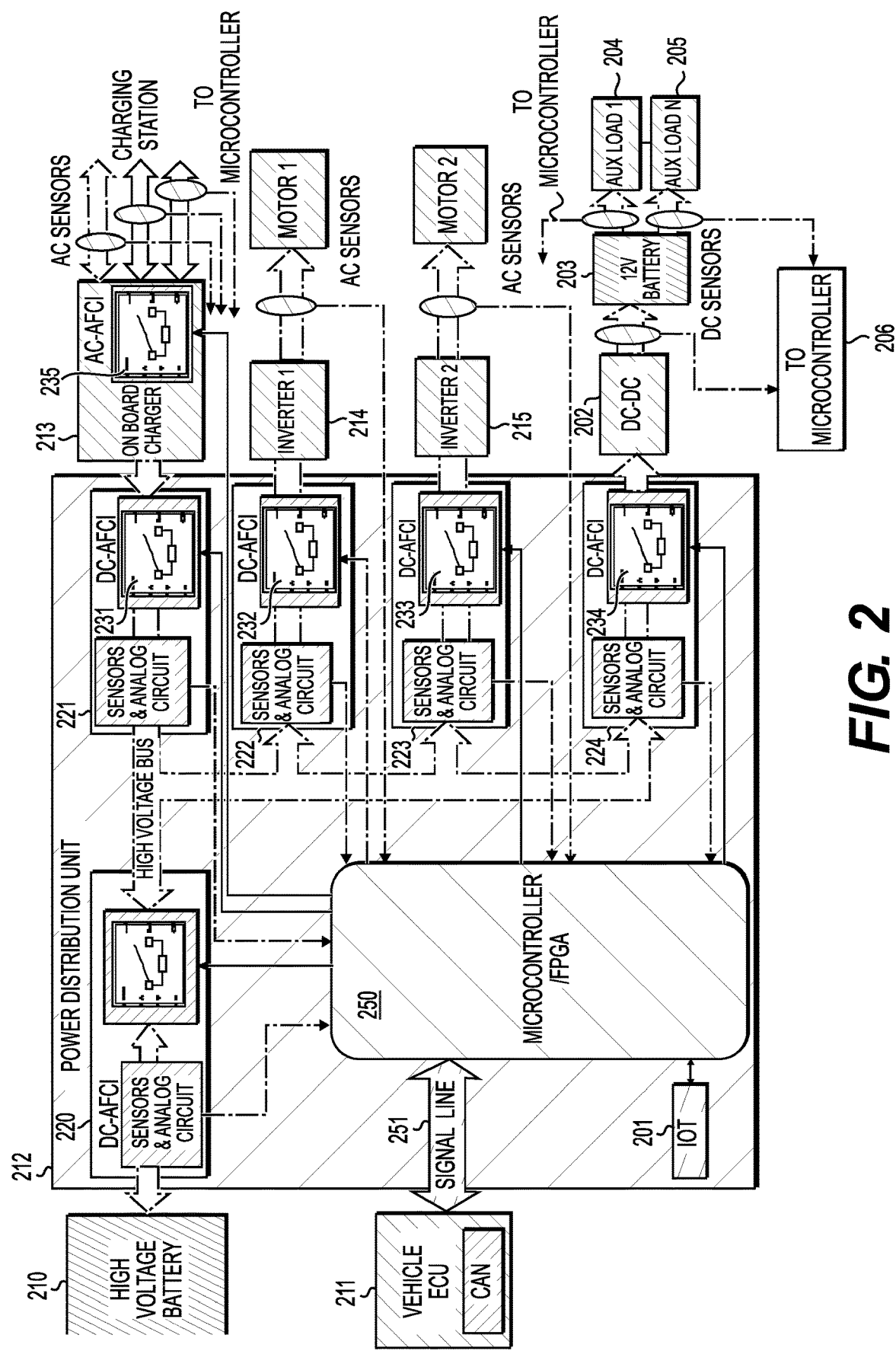
FIG. 2 is an explanatory view of an electric vehicle's electrical system showing the installation of arc fault detection modules.

FIG. 2 is identical to FIG. 1 in most ways but provides more detail on the low voltage load configuration. It shows the DC-DC converter 202, the 12V battery 203, representative low voltage loads 204-205, and communication flow back to the microcontroller 206. The sensors are remote from the microcontroller, indicative of a distribution of components that aggregate into a more sophisticated arc fault detection module that a single system-wide arc fault circuit interrupter. The sensors of FIG. 2 can be tailored for the AC or DC loads that they are monitoring instead of trying to monitor both types of loads with a single AFCI. The sensors can also be tailored for the Voltage (12V, 48V, etc.). The signal conditioning of the arc fault detection module is likewise tailored.

Figure 3A:
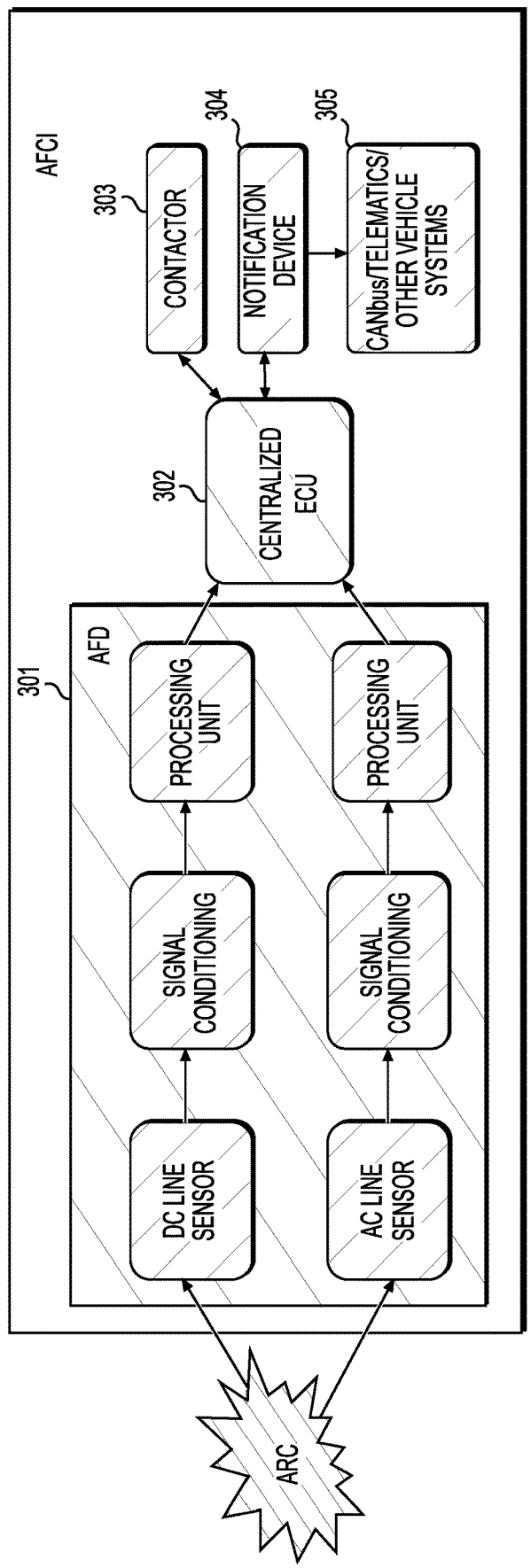
FIG. 3A includes a diagram showing information flow within a type of arc fault detection module.
Figure 3B:
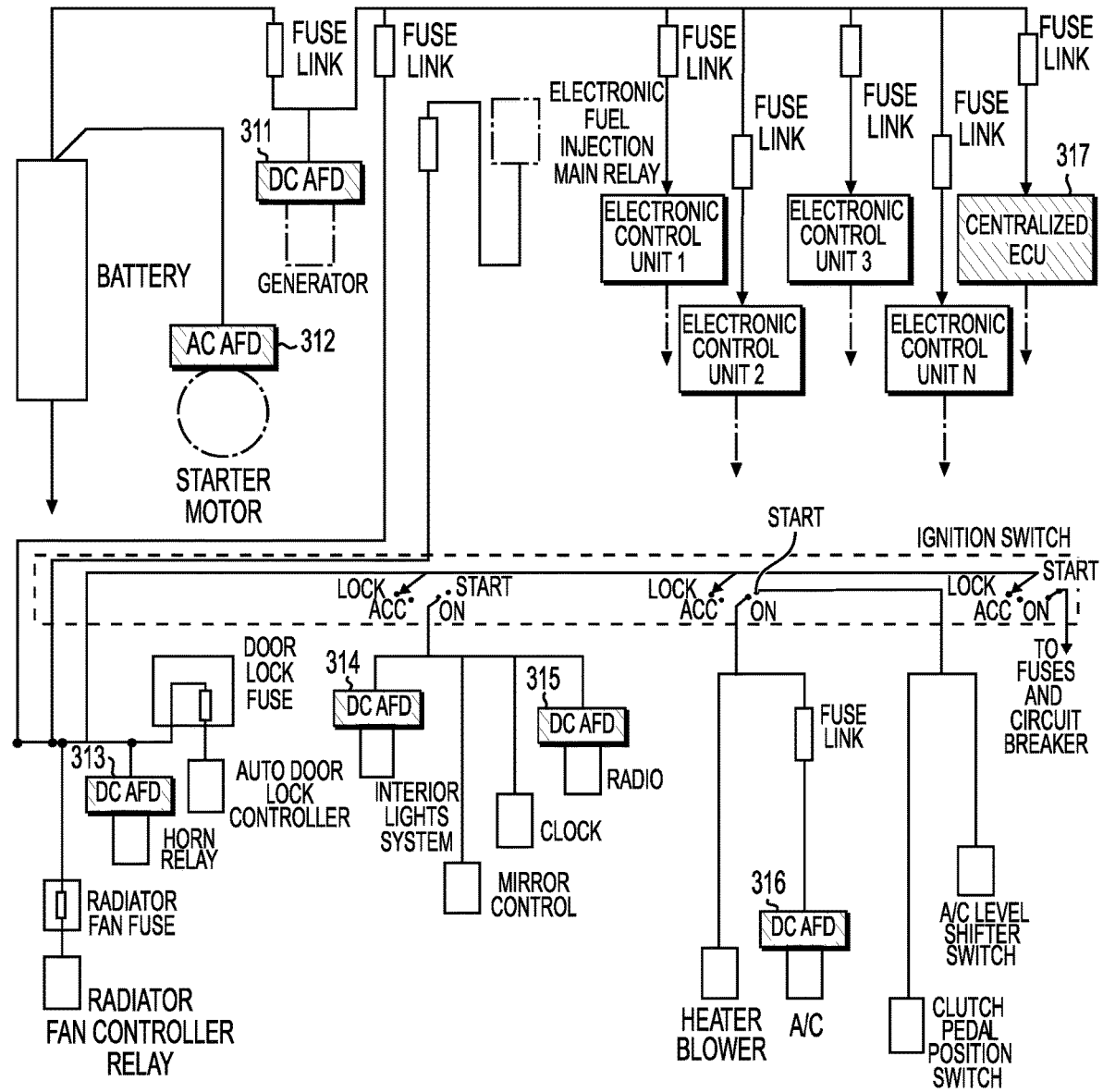
FIG. 3B shows an explanatory view of a vehicle's electrical system showing the installation of arc fault detection modules.

FIG. 3B shows a conceptual diagram of a conventional vehicle's electrical system, showing the installation of arc fault detection modules which rely on a centralized ECU. DC arc fault detection modules 311, and 313-316 along with AC arc fault detection modules are used to protect the vehicle from arc faults. Each of these communicates with the centralized ECU 317 which acts by opening contactors within the vehicle's electrical system to disable the circuit which has experienced an arc fault.

Figure 4B:
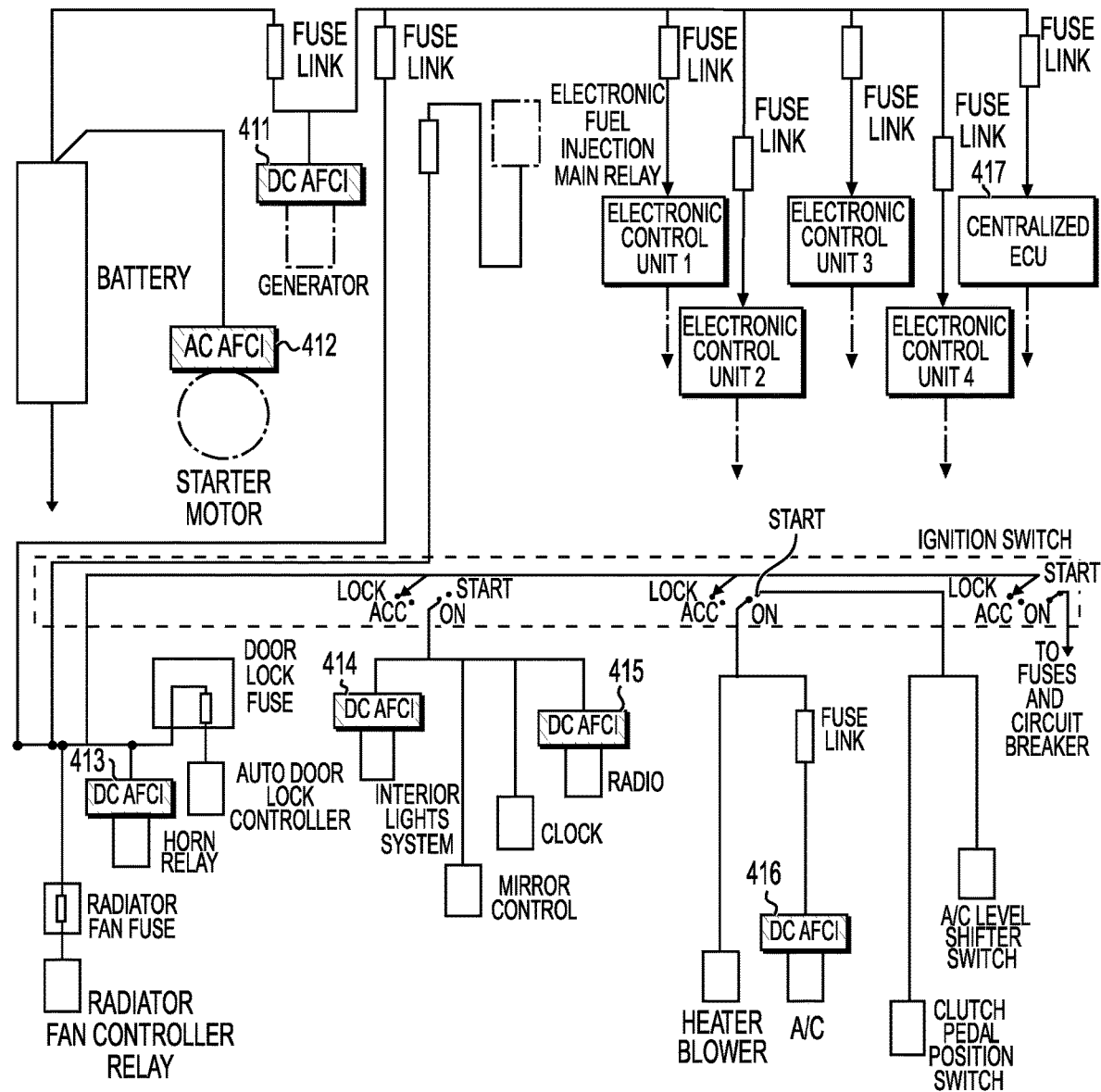
FIG. 4B includes an explanatory view of a conventional vehicle's electrical system showing the installation of arc fault detection modules.

FIG. 4B shows a conceptual diagram of a conventional vehicle's electrical system, showing the installation of arc fault detection modules which can act independently of a central ECU (AFCI type modules). DC AFCI modules 411, and 413-416 along with AC AFCI modules are used to protect the vehicle from arc faults. As seen in FIG. 4A, each of the AFCIs includes one or more notification devices for communicating an arc fault detection to the ECU or other components within the vehicle, to include telematics systems.

Figure 5A:
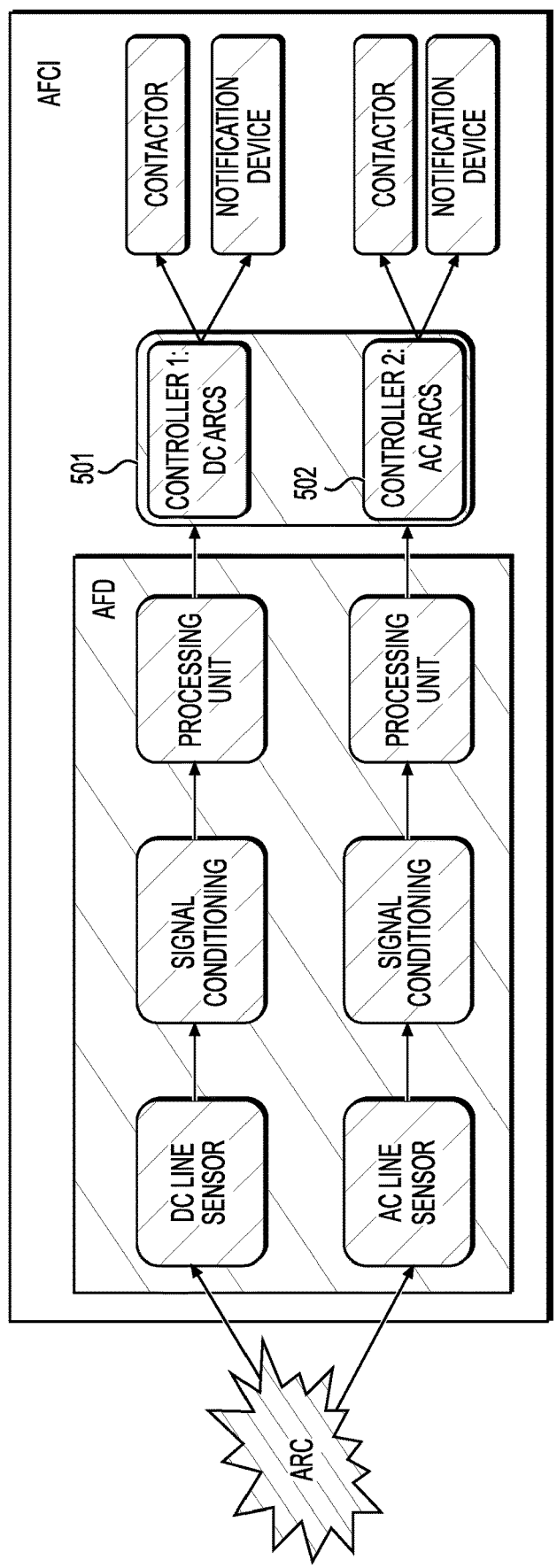
FIG. 5A is a includes a diagram showing information flow within a type of arc fault detection module.

FIG. 5A shows a block diagram showing an alternative implementation of 300. In FIG. 5A, instead of a single ECU 302 handling arc fault detection, as in FIG. 3, direct current arc fault event responses are handled by controller 501 and alternating current arc fault event responses are handled by controller 502.

Should an arc fault be detected by DC AFCI 511, it acts to stop current flow and notifies the controller for DC arc faults 518 within the centralized ECU, of the arc fault event. If an arc fault is detected by AC AFCI 512, it acts to stop current flow, and notifies the controller for AC arc faults 517 within the centralized ECU, which serves as the controller for AC arc faults in this implementation. The system is also protected by a number of DC arc fault detection modules 513-516 which rely on an external control unit for arc fault response. These modules notify controller 518 within the ECU if an arc fault event is detected, and controller 518 responds to address the fault.

Figure 5B:
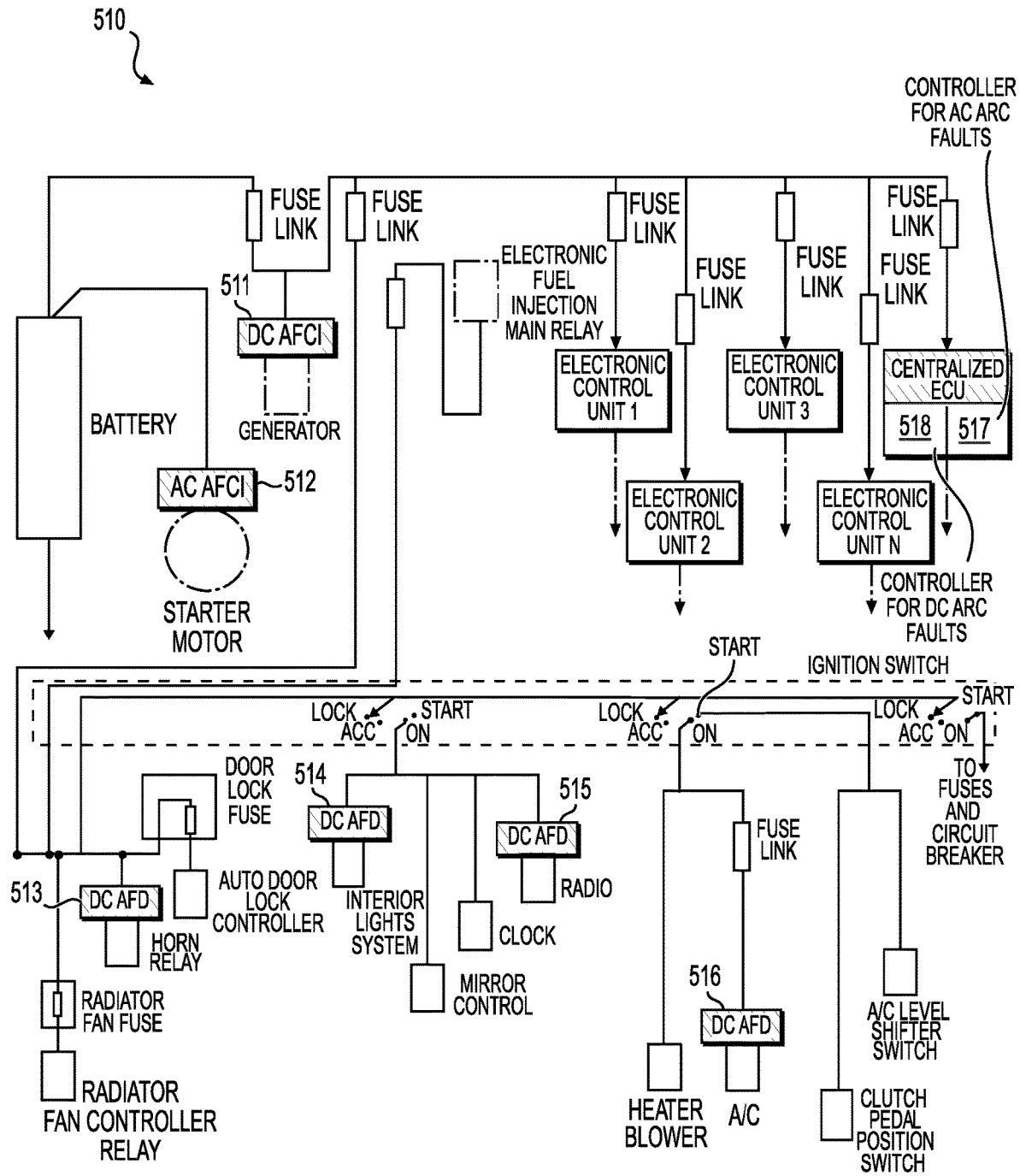
FIG. 5B is an explanatory view of a conventional vehicle's electrical system showing the installation of arc fault detection modules.

In FIG. 5B, we return to the conceptual diagram of a conventional vehicle's electrical system showing the use of separate controllers for direct current and alternating current arc fault event responses. Circuits within the system are protected by a mix of arc fault detection modules with full AFCI capability including notification (511-512), and several direct current arc fault detection modules which rely on an electronic control unit for response to an arc fault detection event. Should an arc fault be detected by DC AFCI 511, it acts to stop current flow and notifies the controller for DC arc faults 518 within the centralized ECU, of the arc fault event. If an arc fault is detected by AC AFCI 512, it acts to stop current flow, and notifies the controller for AC arc faults 517 within the centralized ECU, which serves as the controller for AC arc faults in this implementation. The system is also protected by a number of DC arc fault detection modules 513-516 which rely on an external control unit for arc fault response. These modules notify controller 518 within the ECU if an arc fault event is detected, and controller 518 responds to address the fault.

The disclosed arc fault detection module for a vehicle overcomes the limitations of fuses and circuit breakers by supervising the circuit and continuously checking to determine if the circuit is experiencing a normal arc condition, or an arc fault condition which must be addressed. Alternative devices are compatible with the teachings of this disclosure. As one example, a current detecting section having at least one output, wherein the current detecting section is structured to determine whether at least one signal based on a current measured from a DC supply line exceeds at least one corresponding predetermined threshold level and cause the at least one output to indicate that the threshold level has been exceeded. The module works with processing device structured to: (i) receive the at least one output, (ii) determine whether an arc fault in the DC electrical system has occurred based on at least the at least one output, (iii) determine an estimation of background noise based on at least one signal indicative of a current on the DC supply line, and (iv) adjust the at least one corresponding predetermined threshold level based on the estimation of background noise. Compatible with this disclosure, other methodologies for arc fault detection are outlined in U.S. Pat. Nos. 9,612,267, 9,768,605, 9,797,940 and 9,797,941, assigned to the instant applicant and incorporated into this description in their entirety by reference. Consistent with the teachings herein, the processing device of the referenced patents can be integrated with the AFCI or can be remotely positioned. The example arc fault detection devices are not limiting. Other arc fault detection modules can be compatible with the teachings herein.

The arc fault detection module for a vehicle can either work independently or with other vehicle systems (such as the power distribution unit 112 and electronic control unit 111) through the vehicles' internal network (Controller Area Network, or CAN bus) to perform four basic functions—sense, signal condition, process the conditioned signal, and act when an arc fault is detected.

A smaller arc fault detection module can be distributed around the vehicle and connected to individual loads or small clusters of loads as shown in 311-316, 411-416, and 511-516. The smaller arc fault detection module can be more specialized, and as a result be less expensive than a centralized component. Additionally, the logic of the smaller arc fault detection module can be more closely tailored for the load, as by being designed for either a high or low voltage load, or a DC or AC current configuration. If a discrete arc occurs, the whole vehicle doesn't shut down, and the arc fault detector is more able to react in its intended environment for high or low voltages and DC or AC faults. Below are additional alternatives for actuating a contactor to interrupt a load or cluster of loads.

A module for detecting arc fault in in one of an alternating current circuit or a direct current circuit in a power distribution system of a vehicle can comprise an arc fault detection unit comprising one or more sensors configured for monitoring an alternating current circuit or a direct current circuit for signs of an arc fault and configured for outputting arc fault data; signal conditioning circuitry for receiving and translating arc fault data for processing; a processing unit connected directly or indirectly to the signal conditioning circuitry, the processing unit configured to receive arc fault data from the signal conditioning circuitry and configured to identify an arc fault condition; and a notification device connected to the processing unit, the notification device configured to notify a supervisory controller of an arc fault and configured to communicate other data to the supervisory controller, as shown in 300.

The processing unit can be connected directly to the signal conditioning circuitry in the arc fault detection module as shown in 400.

A notification device 401-402 can be directly connected to the arc fault detection module.

The processing unit 302 can be remote from the arc fault detection unit and communicate via the vehicle's Controller Area Network, or CAN bus as shown in 305.

The notification device may be replaced by a contactor directly or indirectly connected to the processing unit 303, with the contactor configured to interrupt a flow of current when the arc fault condition is identified.

The processing unit 403 can be a microcontroller, where the microcontroller is configured to command the notification device to indicate when a fault has occurred; and where the microcontroller is configured to issue commands to a contactor 404 to interrupt a flow of alternating current circuit or direct current through the circuit monitored by the arc fault detection module.

Alternatively, the processing unit can be a centralized electronic control unit 302, where the centralized electronic control unit is configured to receive and process signal data from other arc fault detection modules and controllers connected to the power distribution system of the vehicle. The centralized electronic control unit is configured to receive and process the arc fault data and to determine when an arc fault condition has occurred, and transmit a command to a contactor 303 to interrupt a flow of alternating current circuit or direct current through the circuit monitored by the arc fault detection unit.

These modules can be configured for installation on either a direct current or alternating current circuit, including direct or indirect connections to a powered unit, such as an on-board charger 113, an inverter 114, or a DC-DC converter 202.

Variants of the arc fault detection module 400 can be configured so they may act independently of other aspects of the vehicle's electrical system. These modules are configured to observe an alternating current circuit or a direct current circuit for signs of an arc fault and include the signal conditioning circuitry, processing logic and a contactor capable of disabling current flow to the observed circuit. When the processing logic determines an arc fault has occurred, it can take independent action to disable current flow through the circuit. The module will then maintain the circuit in a disabled state until physically reset or commanded to reset by a supervisory controller 417. The module can also be configured such that a supervisory controller 417 may enable or disable the observed circuit, as the result of an arc fault detection event or in cases where the supervisory controller 104 decides that disabling the circuit is advantageous.

Within the vehicle electrical system, there are also potential configurations 300 where alternating current and direct current circuits in a vehicle's electrical system are monitored by arc fault detection modules networked to a supervisory controller using the vehicle's Controller Area Network (or CAN bus). The supervisory controller 317 is further networked to a number of remote contactors within the vehicle able to disable current flow through the monitored circuits. The arc fault detection modules 311-316 sense, condition, and determine when an arc fault has occurred, transmitting this conclusion to the supervisory controller 317. The supervisory controller 317 will then take action to address the arc fault detection event based on its programming to manage current flow in the vehicle electrical system by commanding remote contactors.

Another potential configuration shown in FIG. 5b utilizes arc fault detection modules capable of independently disabling current flow on a circuit 511-512 in combination with modules which transmit an arc fault detection event 513-516 to the supervisory controllers 517-518, which then uses remote contactors to disable current flow through the monitored circuit.

A vehicle electric system can comprise a supervisory controller 302 networked to at least one remote contactor, a first circuit comprising a first module, and a second circuit comprising a second module.

The first circuit and the second circuit are selected among an alternating current circuit or direct current circuit. The first module comprises first processing logic and a first contactor configured to disable the first circuit independently of the supervisory controller when an arc fault is detected 511. The second module 513 is configured to transmit arc fault detection data to a supervisory controller 518. The supervisory controller 518 can be programmed to receive and process the transmitted arc fault detection data, and, when an arc fault condition is detected, the supervisory controller can be programmed to manage current flow in the vehicle electrical system by commanding at least one remote contactor to disable.

Other implementations will be apparent to those skilled in the art from consideration of the specification and practice of the examples disclosed herein.

What is claimed is:
1. A vehicle electric system comprising:
  one or more circuits, the one or more circuits comprising a plurality of modules, each module of the plurality of modules, comprising:
  an arc fault detection unit comprising:
  one or more sensors configured for monitoring an alternating current circuit or a direct current circuit for signs of an arc fault and configured for outputting arc fault data, and
  a signal conditioning circuitry for receiving and translating arc fault data for processing,
  a processing unit connected directly or indirectly to the signal conditioning circuitry, the processing unit configured to receive arc fault data from the signal conditioning circuitry and configured to identify an arc fault condition, and
  a notification device connected to the processing unit, the notification device configured to notify a supervisory controller of an arc fault and configured to communicate other data to the supervisory controller, and the supervisory controller networked to the plurality of modules, wherein the vehicle electric system is configured with a plurality of remote contactors, wherein each module of the plurality of modules is configured to supervise respective one of the alternating current circuit or direct current circuit to collect and process arc fault data;

wherein each module of the plurality of modules is configured to transmit arc fault detection data to the supervisory controller; and wherein the supervisory controller is programmed to manage current flow in the vehicle electrical system by commanding one or more of the remote contactors to open, disabling current flow to the one or more circuits, when an arc fault condition is detected.

2. The vehicle electric system of claim 1, wherein the processing unit is connected directly to the signal conditioning circuitry in the arc fault detection unit.

3. The vehicle electric system of claim 2, wherein the notification device is connected to the arc fault detection unit.

4. The vehicle electric system of claim 1, wherein the processing unit is an external circuit from the arc fault detection unit.

5. The modulevehicle electric system of claim 1, further comprising a contactor directly or indirectly connected to the processing unit, the contactor configured to interrupt a flow of current through the monitored circuit when an arc fault condition is identified.

6. The vehicle electric system of claim 5, wherein the processing unit is a microcontroller, and wherein the microcontroller is configured to command the notification device to indicate an operational status or a non-operational status; and wherein the microcontroller is configured to command the contactor to interrupt a flow of the alternating current circuit or direct current through the circuit monitored by the arc fault detection unit.

7. The vehicle electric system of claim 5, wherein the processing unit comprises a centralized electronic control unit, wherein the centralized electronic control unit is configured to receive and process signal data from other controllers connected to the power distribution system of the vehicle, and wherein the centralized electronic control unit is configured to receive and process the arc fault data and to transmit a command to the notification device to indicate an operational status or a non-operational status and is configured to transmit a command to the contactor to interrupt a flow of alternating the current circuit or direct current through the circuit monitored by the arc fault detection unit.

8. The vehicle electric system of claim 1 wherein the one of the alternating current circuit or direct current circuit comprises a direct or indirect connection to a powered unit, and wherein the powered unit comprises one of an On-Board Charger, an inverter, or a DC-DC converter.

* * * * *